United States Patent
Huang et al.

[11] Patent Number: 6,114,752
[45] Date of Patent: Sep. 5, 2000

[54] SEMICONDUCTOR PACKAGE HAVING LEAD FRAME WITH AN EXPOSED BASE PAD

[75] Inventors: Chion-Ping Huang, Hsinchu Hien; Cheng-Yuan Lai, Taichung; Raymond Jao, Miaoli, all of Taiwan

[73] Assignee: Siliconware Precision Industries Co., Ltd., Taichung, Taiwan

[21] Appl. No.: 09/382,742

[22] Filed: Aug. 25, 1999

[30] Foreign Application Priority Data

Nov. 10, 1998 [TW] Taiwan .................................. 87118651

[51] Int. Cl.⁷ ........................... H01L 23/495; H01L 23/28
[52] U.S. Cl. .......................... 257/666; 257/787; 257/793
[58] Field of Search .................................. 252/666, 787, 252/793; 438/123, 124, 126, 366, 367, FOR 384

[56] References Cited

U.S. PATENT DOCUMENTS

| | | | |
|---|---|---|---|
| 4,258,381 | 3/1981 | Inaba ....................................... | 257/666 |
| 4,857,989 | 8/1989 | Mori et al. ............................... | 257/666 |
| 5,214,307 | 5/1993 | Davis ....................................... | 257/666 |

FOREIGN PATENT DOCUMENTS

| | | | |
|---|---|---|---|
| 61-174657 | 8/1986 | Japan ..................................... | 257/666 |
| 63-150951 | 6/1988 | Japan ..................................... | 257/666 |

*Primary Examiner*—David Hardy
*Assistant Examiner*—Jhihan B Clark
*Attorney, Agent, or Firm*—Peter F. Corless; Dike, Bronstein, Roberts & Cushman, LLP

[57] ABSTRACT

A semiconductor package includes a lead frame having a die pad for a semiconductor chip to be mounted thereon. The die pad is surrounded by a plurality of leads for electrically connecting the semiconductor chip and has one opening formed to decrease the attaching area between the semiconductor chip and the die pad so as to prevent the occurrence of declamination. A base pad is provided to be coupled to the die pad in such a manner that the base pad is positioned underneath or above the die pad and has a bottom surface or a top surface to be exposed to the extension of a resin encapsulant for enclosing the semiconductor chip and a portion of the lead frame, allowing the base pad to serve as a heat dissipater for transferring heat of the semiconductor package to the ambient.

15 Claims, 8 Drawing Sheets

SEMICONDUCTOR PACKAGE HAVING LEAD FRAME WITH AN EXPOSED BASE PAD

FIELD OF THE INVENTION

The present invention relates to semiconductor packages, and more particularly, to a semiconductor package having a lead frame on which a semiconductor chip is mounted and for heat dissipation.

FIELD OF THE PRIOR ART

As the amount of heat generated by a semiconductor chip increases with the increase in electronic components such as transistor, resistor, and capacitor contained in a semiconductor chip, how to effectively dissipate heat produced by a semiconductor chip becomes one of major concerns of modern semiconductor package and system designers. To solve the heat dissipation problem, one approach which is most commonly employed by the industry is to embed a heat sink (heat slug) within the semiconductor package by making the heat sink directly contact with or approximate to the semiconductor chip; and in some cases the heat sink is mounted in the semiconductor package in such a manner that a surface of the heat sink is exposed to the outside of the package body for more effectively dissipating heat produced by the semiconductor chip to the atmosphere via the heat sink. However, the incorporation of a heat sink into a semiconductor package increases the production cost and assembly processes and requires extra equipments therefor. Meanwhile, voids are subject to being formed between the semiconductor chip and heat sink, thereby popcorn cracks of the package body tend to occur during the high temperature curing process for curing the package body.

For overcoming the problems arising from incorporation of heat sinks into semiconductor packages U.S. Pat. No. 5,594,234 discloses a semiconductor package having a lead frame with a die mount pad being exposed to the exterior of the package body. As shown in FIG. 7A to 7C, a lead frame 10 comprises a plurality of leads 11 positioned on a first horizon plane I, a die pad 12 for bearing a semiconductor chip 30 and being downset from the plane I to a second horizontal plane 11, and notched wings 14, 15, 17, and 18 connected with or adjacent to the leads 11 and extending upward and outward from the die pad 12. The die pad 12, as a thermal conductive media, is adapted to expose its bottom surface 12a to the exterior of the package body 31 for encapsulating the semiconductor chip 30 in order to effectively remove heat produced by the semiconductor chip 30 through the die pad 12 to the ambient. However, the semiconductor chip 30 is attached to the die pad 12 in a surface-to-surface manner such that during the packaging process, declamination of the semiconductor chip 30 from the die pad 12 tends to occur due to the thermal stress resulted from the difference in Coefficient of Thermal Expansion (CTE) between the semiconductor chip 30 and the die pad 12. Meanwhile, from FIG. 7A, it is clear that there are gaps between any two adjacent notched wings, such as wings 14 and 17, of the die pad 12. As the bottom surface 12a of the die pad 12 is directly exposed to the exterior of the package body 31, the gaps between any two adjacent notched wings provide penetration paths for outside moisture to enter the interior of the package body 31. And, because the semiconductor chip 30 is mounted on the die pad 31, making it relatively close to the moisture penetration paths, moisture from the ambient is easy to accumulate on the surface of the semiconductor chip 30 via the moisture penetration path. As a result, popcorn cracks caused by expansion of moisture resulting from the head added at the time of mounting the semiconductor package on a printed wiring board, can occur to pose reliability concerns. Therefore, a solution to the problems of declamination and package cracking associated with using a die pad with an exposed surface as a thermal conductive media is needed.

SUMMARY OF THE INVENTION

It is therefore a object of the present invention to provide a semiconductor package which can effectively reduce the declamination and package cracking concerns.

Another object of the present invention is to provide a semiconductor package which can prevent moisture from the ambient from accumulating on the surface of the semiconductor package.

Still another object of the present invention is to provide a semiconductor package which can effectively remove the heat from the package body without the use of a heat sink.

Yet another object of the present invention is to provide a semiconductor package which can directly dissipate heat produced by the semiconductor chip to the exterior of the package body through the lead frame.

Still another object of the present invention is to provide a semiconductor package, which can be assembled by way of conventional assembly steps and equipments so that no additional production cost is needed.

In accordance with the foregoing and other objectives of the present invention, a semiconductor package having a lead frame with an exposed base pad is provided. The semiconductor package of the present invention comprises a lead frame having a plurality of leads. Each lead has an inner portion an outer portion. The lead frame further has a die pad formed with at least an opening and a base pad longitudinally and parallelly spaced apart from the die pad. A semiconductor chip is adhered to the die pad by a die attach adhesive and electrically connected with the inner portions of the leads, allowing a portion of an attaching surface of the semiconductor chip to be adhered to the die pad and another portion thereof to be exposed to the opening of the die pad. The semiconductor chip, inner portions of the leads, the die pad, and the base pad are encapsulated by a resin encapsulant in such a manner that a bottom surface of the base pad is exposed on the exterior of the resin encapsulant.

In the embodiment according to the invention, the plurality of leads of the lead frame are positioned in a first horizontal plane and the die pad is in a second horizontal plane downset from the first horizontal plane. Likewise, the base pad is in a third horizontal plane downset from the second horizontal plane, allowing the bottom surface of the base pad to expose on and to be planar with the underside of the resin encapsulant. The base pad is also longitudinally corresponding to the opening of the die pad so that the base pad is positioned below the opening of the die pad.

In another embodiment according to the invention, the plurality of leads are planar with the die pad, allowing the leads and the die pad to be in a first horizontal plane. The base pad may be in a second horizontal plane either downset or elevated from the first horizontal plane. While the base pad is elevated from the die pad, the semiconductor chip may be either positioned between the base pad and the die pad on which the semiconductor chip is mounted, or adhered to the die pad in such a manner that the die pad is positioned between the based pad and the semiconductor chip.

The above and other objects, features and advantage of the present invention will be more clearly understood from

DETAILED DESCRIPTION OF THE PREFERRED EMBODIMENTS

Figure 1:
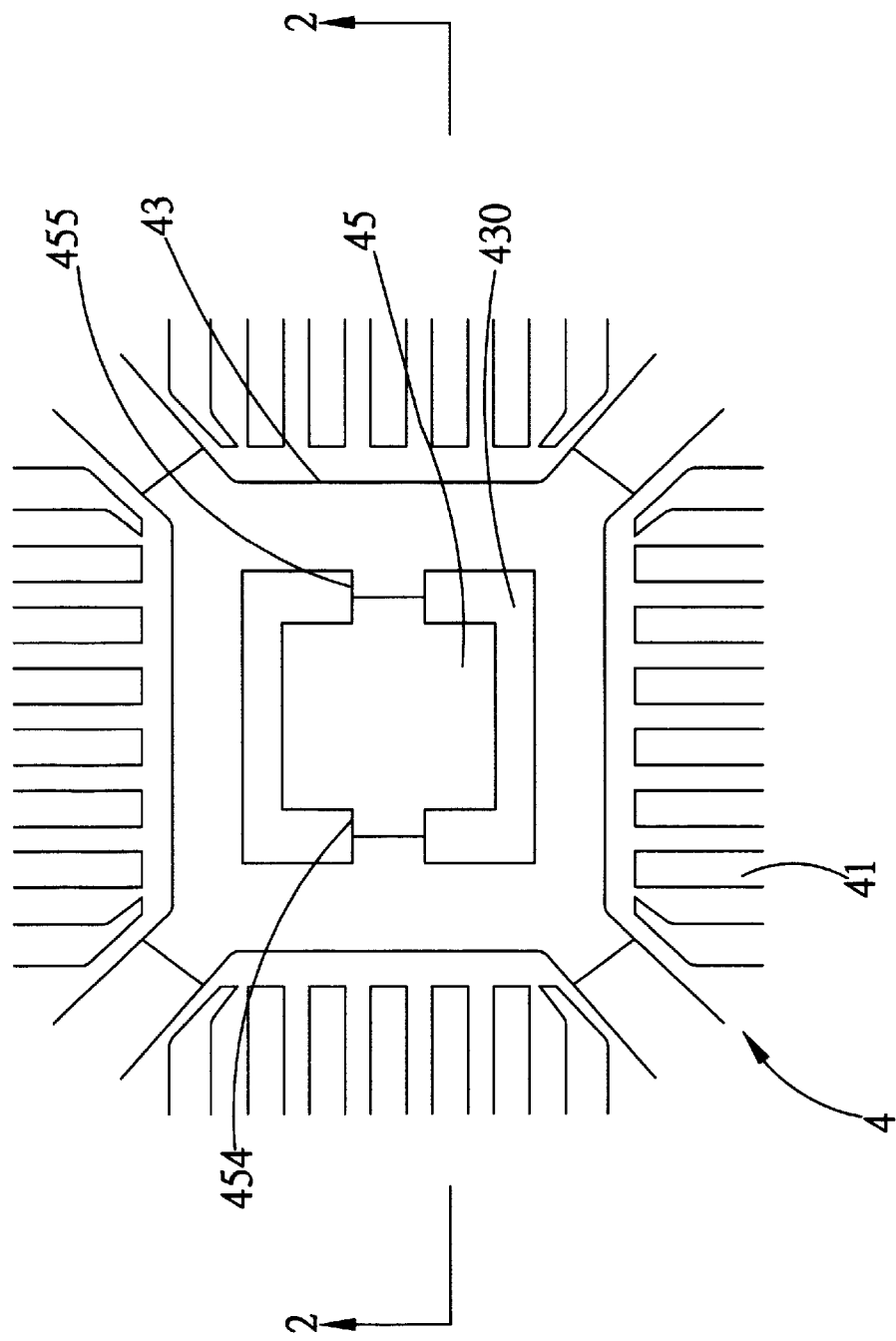
FIG. 1 is a top view of a lead frame suitable for use in a semiconductor package in accordance with the first embodiment of the present invention.
Figure 2:
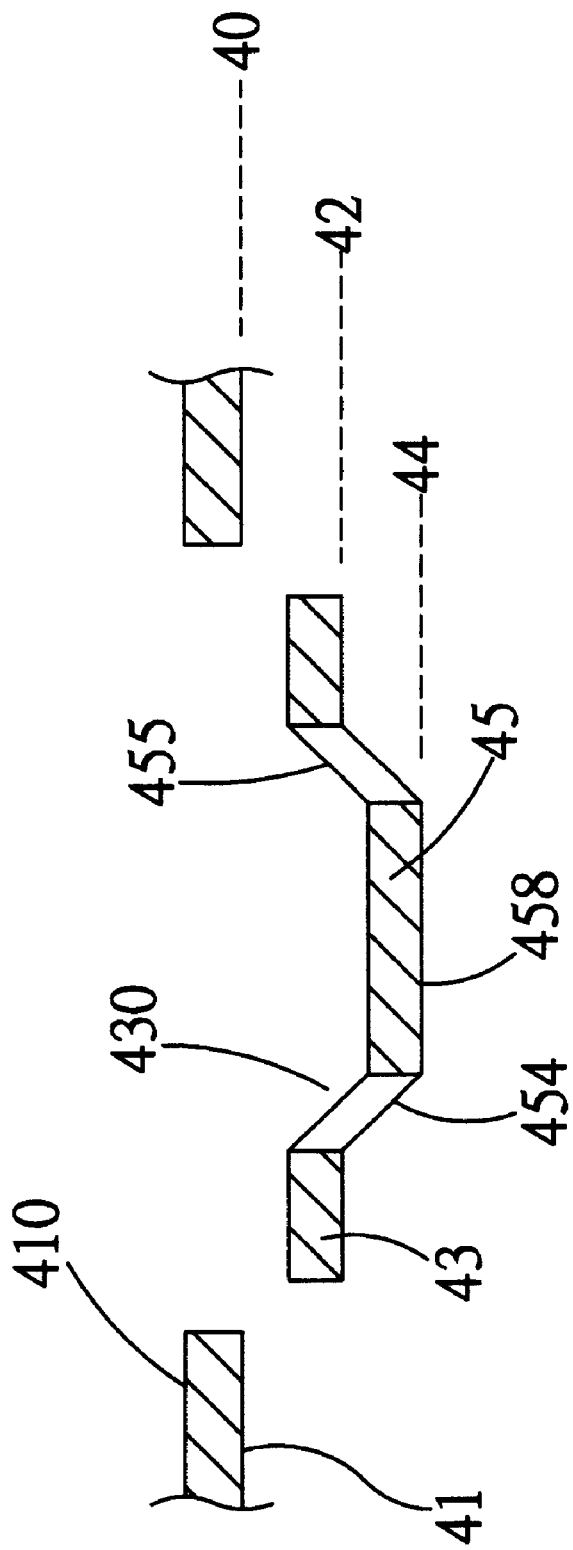
FIG. 2 is a cross-sectional view of the lead frame of FIG. 1 cutting through the line 2—2.

As shown in FIGS. 1 and 2, the lead frame 4 for use in the first embodiment of the present invention includes a plurality of leads 41 in a first horizontal plane 40, a die pad 43 in a second horizontal plane 42 downset from the first horizontal plan 40, and a base pad 45 in a third horizontal plane 44 downset from the second horizontal plane 42. The leads 41 extend radially from the die pad 43 and each of them has an inner portion 410 and an outer portion 411. The base pad 45 is connected to the die pad 43 by a pair of opposing coupling bars 454 and 455 so that the base pad 45 is securely positioned underneath an opening 430 formed in the die pad 43. The opening 430 of the die pad 43 can be in a shape such as rectangle, square, or circle. The member of the opening 430 may be also more than one.

Figure 3:
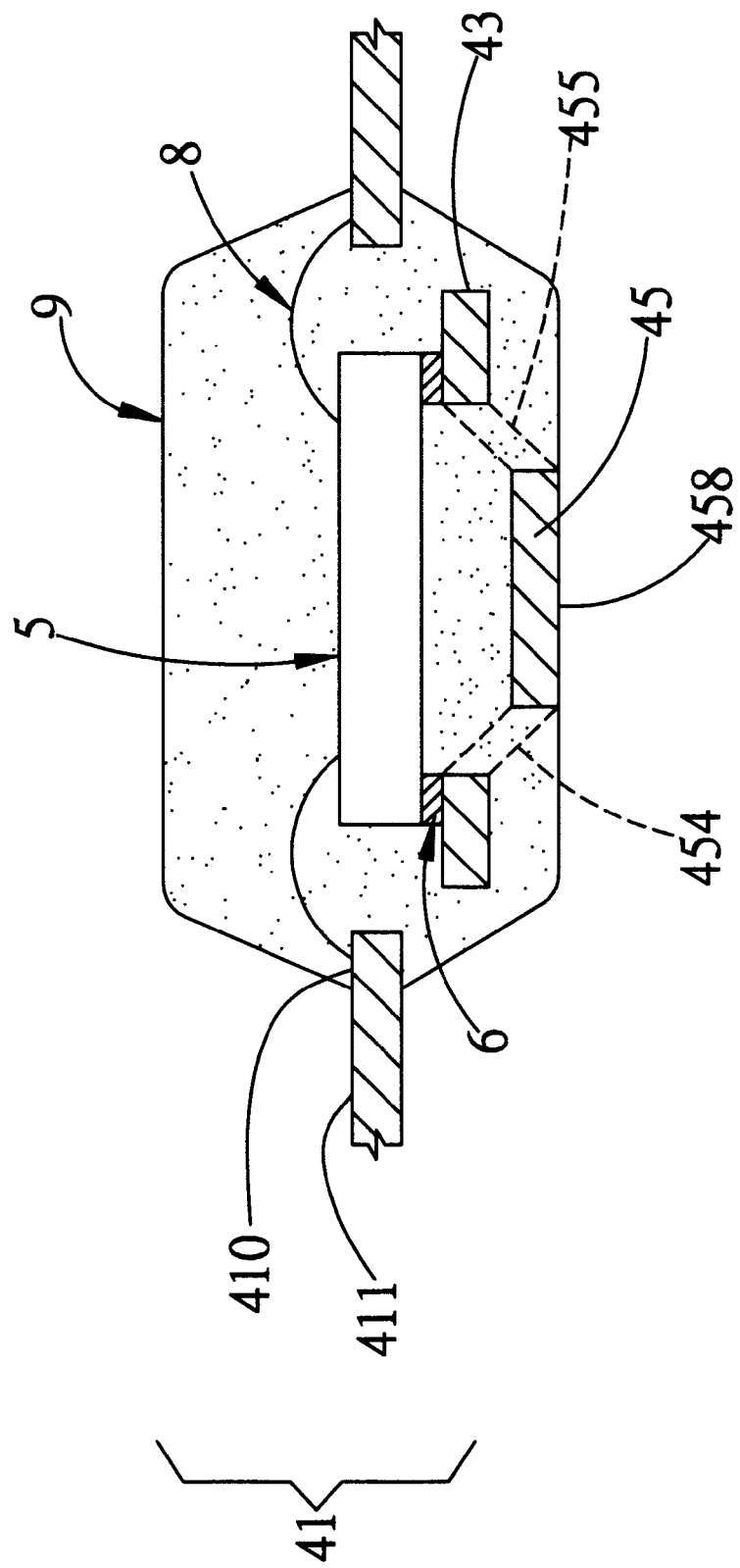
FIG. 3 is a cross-sectional view of the semiconductor package in accordance with the first embodiment of the present invention.

Referring now to FIG. 3, the semiconductor package in accordance with the first embodiment of the present invention includes a semiconductor chip 5 mounted on the die pad 43 with an adhesive 6, such as silver-filled epoxy, and electrically connected to the inner portion 410 of the lead 41 via bonding wires 8, allowing the semiconductor chip 5 to be electrically accessible to external facilities via the outer portion 411 of the lead 41. As the die pad 43 is formed with an opening 430, a substantial portion of the underside of the semiconductor chip 5 is exposed to the opening 430 and without attachment to the die pad 43. This allows the attaching area of the semiconductor chip 5 to the die pad 43 to be considerably reduced and permits declamination of the semiconductor chip 5 from the die pad to be effectively minimized. By transfer molding, the semiconductor chip 5, the bonding wires 8, the die pad 43, the inner portion 410 of the lead 41, and a portion of the base pad 45 are encapsulated by a resin encapsulant 9 formed by a conventional molding resin. After the resin encapsulant 9 has been formed, a bottom surface 458 of the base pad 45 is planar with and exposed to the underside of the resin encapsulant 9, allowing the heat generated by the semiconductor chip 5 to be transferred from the die pad 43 to the base pad 45 via the coupling bars 454, 455 and then directly dissipated to the ambient. Because the bottom surface 458 of the base pad 45 is exposed on the underside of the resin encapsulant 9, the base pad 45 provides the semiconductor chip 5 with a thermal conductive media for directly and effectively dissipating the heat from the semiconductor chip 5 to the outside of the semiconductor package of this invention. This also provides direct contact o fate semiconductor chip 5 to an external thermal conductive device and thus eliminates the need of an internal heat sink.

The die pad 43 is formed with the opening 430 such that mold locking of the molding resin of the resin encapsulant 9 to the die pad is enhanced. This provides the semiconductor package of the present invention with improved mechanical property.

The semiconductor chip 5 is mounted on the die pad 43 instead of the base pad 45 and the base pad 45 is downset from the die pad 43, so that the moisture path from the underside of the resin encapsulant 9 to the semiconductor chip 5 is increased. The increase of the moisture path effectively eliminates the possibility that the moisture which penetrates into the resin encapsulant 9 reaches the semiconductor chip 5. As a result, the occurrence of cracks resulting from expansion of the moisture due to the heat added at the time of mounting the assembled semiconductor package on a printed wiring board, is prevented.

In addition to expose the bottom surface 458 of the base pad 45 on the underside of the resin encapsulant 9, the third horizontal plane 44 where the base pad 45 is positioned should be downset from the first horizontal plane 40 where the leads 41 are positioned to an extent that the base pad 45 is able to be in contact with a bottom of a mold cavity of a mold (not shown) for encapsulating the semiconductor chip 5 and the lead frame 4, at the time of placing the lead frame 4 in the mold cavity for performing transfer molding.

Figure 4:
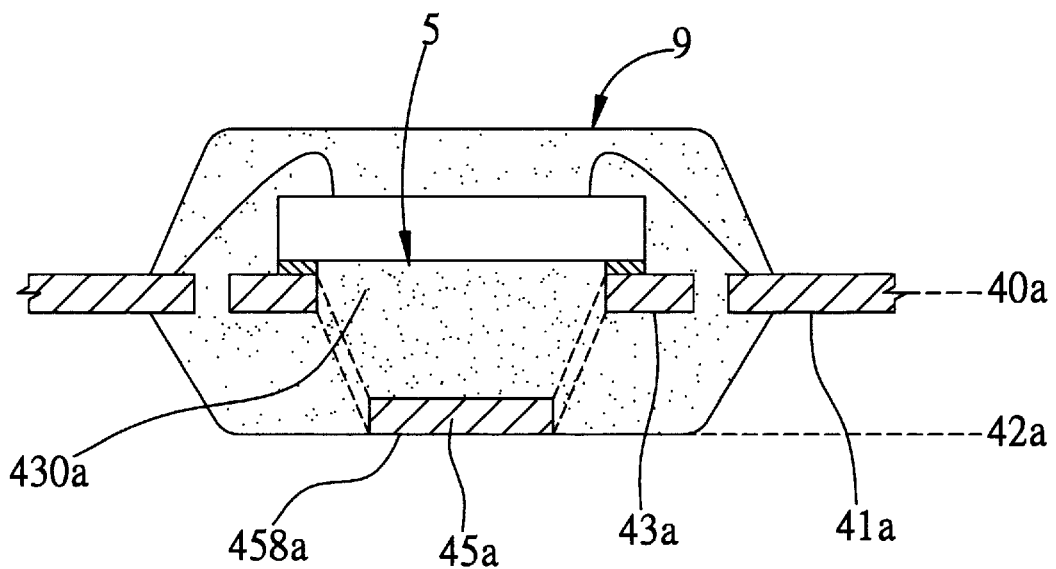
FIG. 4 is a cross-sectional view of the semiconductor package in accordance with the second embodiment of the present invention.
Figure 5:
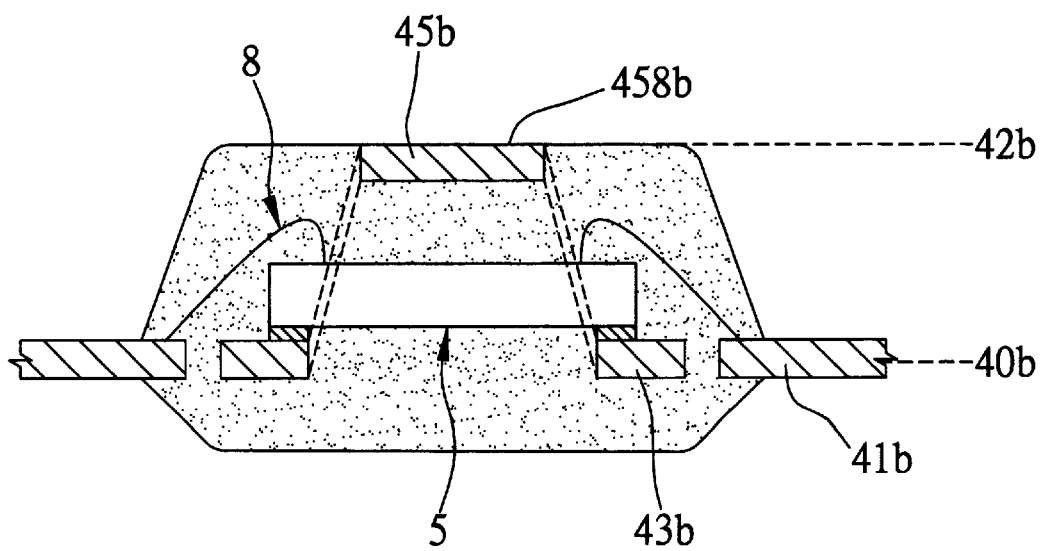
FIG. 5 is a cross-sectional view of the semiconductor package in accordance with the third embodiment of the present invention.

Referring to FIGS. 4 and 5, there are shown a second embodiment and a third embodiment of the semiconductor package in accordance with the present invention. In FIGS. 4 and 5, elements corresponding to those shown in FIG. 3 are given the same reference numerals, and explanation thereof will be omitted for simplification of the description.

As shown in FIG. 4, the semiconductor package according to the second embodiment is structurally corresponding to that illustrated in FIG. 3 except the lead frame. The lead frame of the second embodiment has a plurality of leads 41a radially extending from a die pad 43a. The leads 41a and the die pad 43a are positioned in a first horizontal plane 40a. Beneath the die pad 43a there is provided a base pad 45a in a second horizontal plane 42a downset from the first horizontal plane 40a. This allows a bottom surface 458a of the base pad 45a to be exposed to the underside of a resin encapsulant 9 which encloses the die pad 43a and a semiconductor chip 5 mounted thereon, after a transfer molding process is completed. The die pad 43a is also formed with an opening 430a so as to decrease the adhering area between the die pad 43a and the semiconductor chip 5.

Referring now to FIG. 5, the semiconductor package according to the third embodiment is also structurally corresponding to that illustrated in FIG. 3 except the lead frame. While the lead frame of the third embodiment has a plurality of leads 41b planar with a die pad 43b in a first horizontal plane, a base pad 45b is provided above the die pad 43b and positioned in a second horizontal plane 42b elevated from the first horizontal plane 40b. In this arrangement, a semiconductor chip 5 which is mounted on the die pad 43b is positioned between the die pad 43b and the base pad 45b. Therefore, the elevation of the base pad 45b from the first horizontal plane 40b to the second horizontal plane 42b should be high enough to prevent contact of the base pad 45b with bonding wires 8 for electrically connecting a semiconductor chip 5 attached to the die pad 43b and the leads 41b, as well as to allow a top surface 458b of the base pad 45b to be exposed on the aboveside of the resin encapsulant 9.

Figure 6:
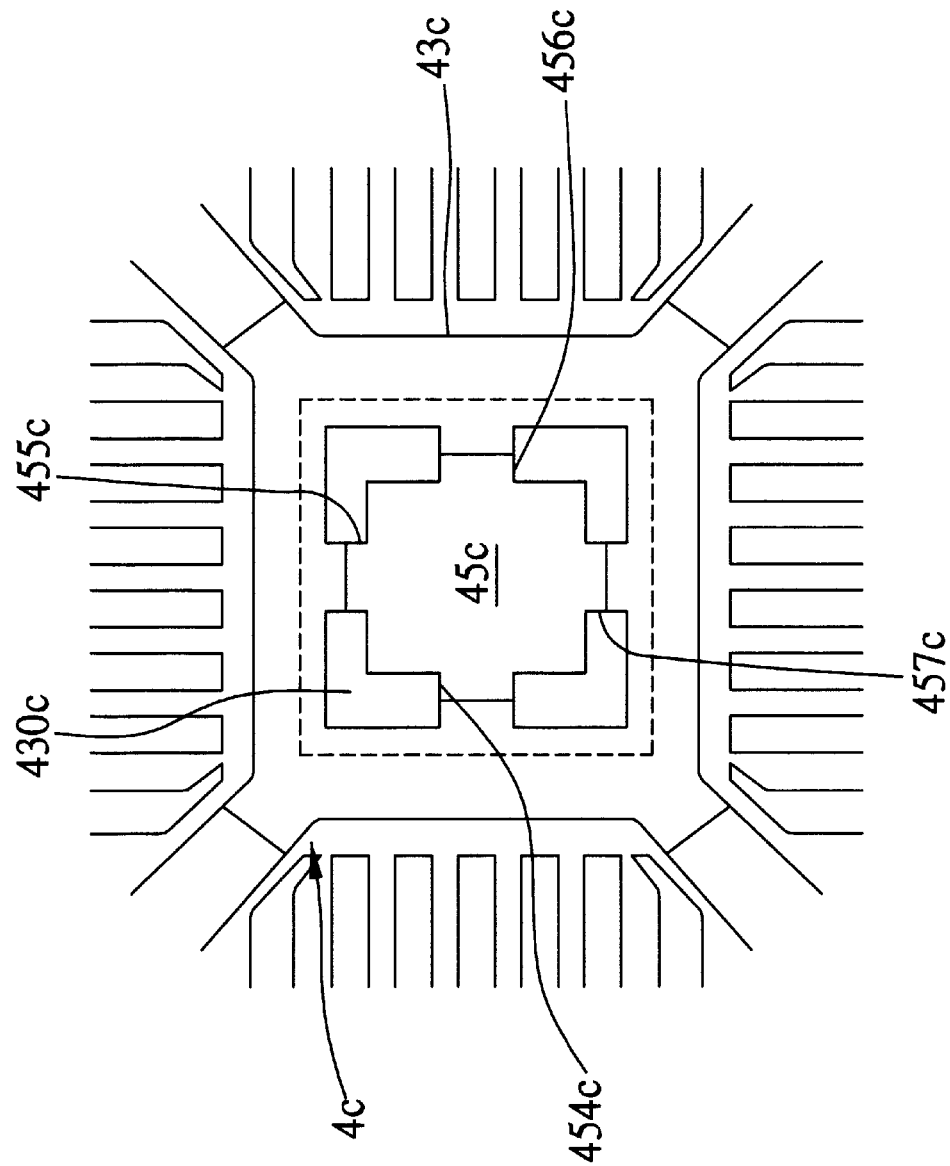
FIG. 6 is a top view of a lead frame suitable for use in a semiconductor package in accordance with the fourth embodiment of the present invention.
Figure 7A:
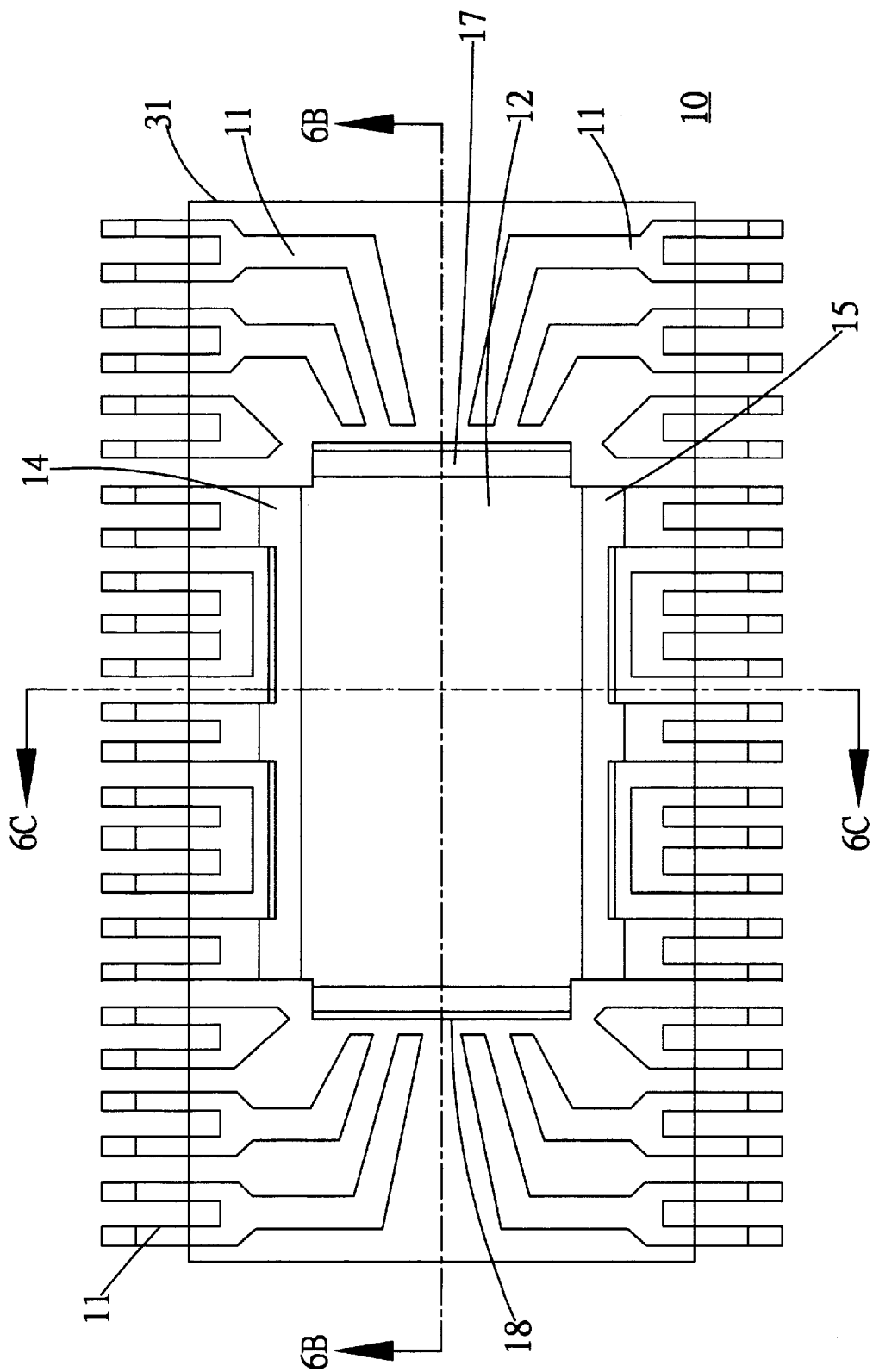
FIG. 7A is a top view of a conventional semiconductor package.
Figure 7B:
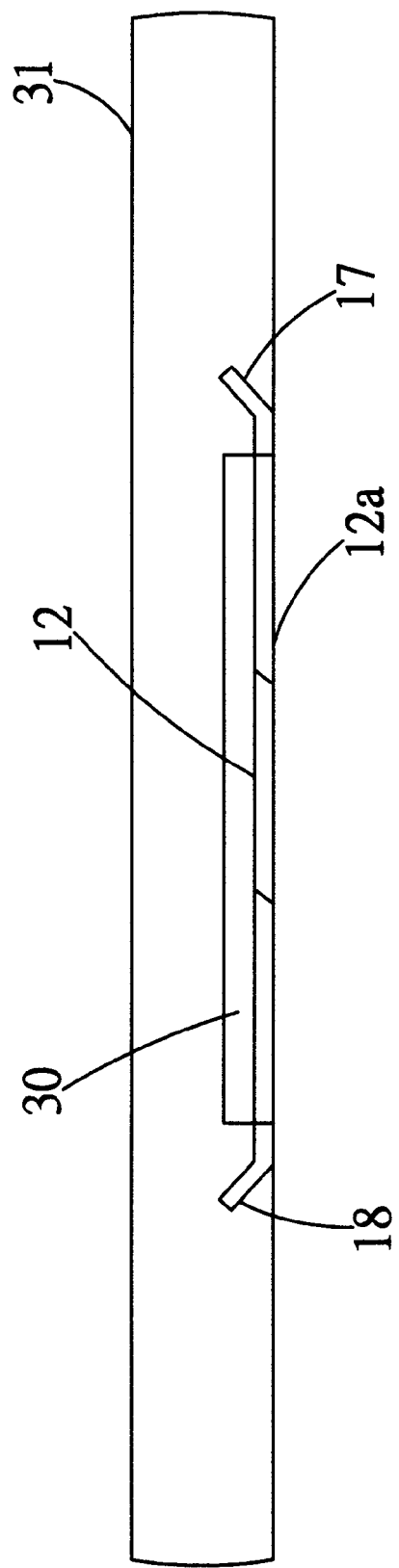
FIG. 7B is a cross-sectional view of the semiconductor package of FIG. 7A cutting through the line 7B–7B.
Figure 7C:
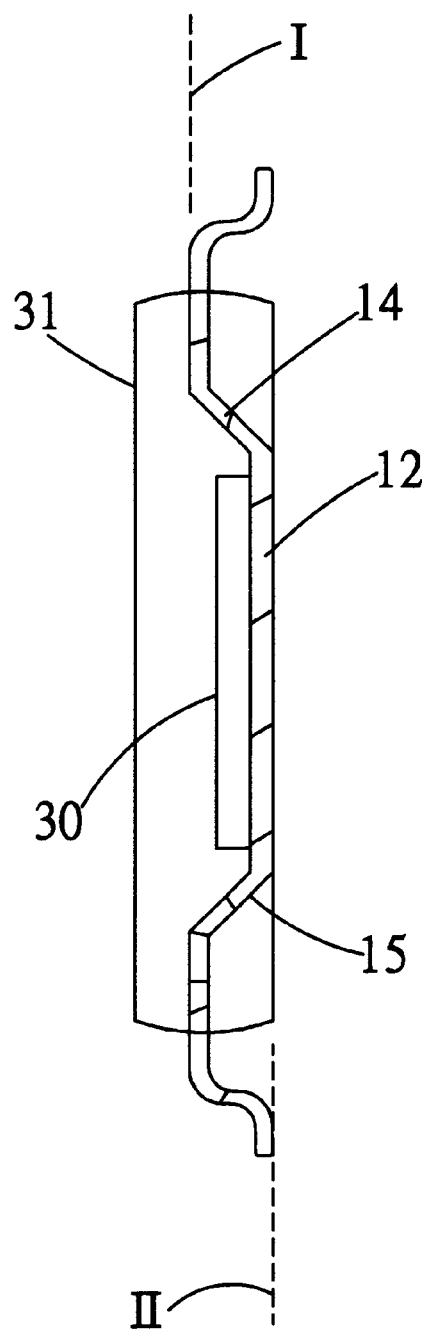
FIG. 7C is a cross-sectional view of the semiconductor package of FIG. 7A cutting through the line 7C–7C.

FIG. 6 is a top view of a lead frame suitable for use in the semiconductor package in accordance with a fourth embodiment of the present invention. The lead frame 4c of the fourth embodiment is structurally similar to that illustrated in FIGS. 1 and 2 except that a base pad 45c of the lead frame 4c is coupled to a die pad 43c having an opening 430c via four coupling leads 454c, 455c, 456c and 457c. Each of the coupling leads 454c, 455c, 456c and 457c has one end connected to one corresponding side of the base pad 45c and another end connected to one corresponding edge of the opening 430c of the die pad 43c. In this arrangement, the coupling of the base pad 45c to the die pad 43c is enhanced.

The present invention has been described hitherto with exemplary preferred embodiments. However, it is to be understood that the scope of the present invention need not to be limited to the disclosed preferred embodiments. On the contrary, it is intended to cover various modifications and similar arrangements with the scope defined in the following appended claims. The scope of the claims should be accorded the broadest interpretation so as to encompass all such modifications and similar arrangements.

What is claimed is:

1. A semiconductor chip, comprising:
a lead frame having a plurality of leads in a first horizontal plane, a die pad having at least one opening and in a second horizontal plane downset from the first horizontal plane, and a base pad having a bottom surface and in a third horizontal plane downset from the second horizontal plane which allows the base pad to be positioned. underneath the die pad;
a semiconductor chip mounted on the die pad and electrically connected to the leads; and
a resin encapsulant for enclosing the semiconductor chip, the die pad, a portion of the leads, and a portion of the base pad in such a manner that the bottom surface of the base pad is exposed to an underside of the resin encapsulant.

2. The semiconductor package of claim 1, wherein the base pad is coupled to the die pad via a plurality of coupling leads.

3. The semiconductor package of claim 1, wherein the bottom surface of the base pad is planar with the underside of the resin encapsulant.

4. The semiconductor package of claim 1, wherein the bottom surface of the base pad provides the semiconductor chip with a direct heat dissipating path to the ambient.

5. The semiconductor package of claim 1, wherein the leads radially extend from the die pad.

6. A semiconductor package, comprising:
a lead frame having a plurality of leads, a die pad having at least one opening and being planar with the leads in a first horizontal plane, and a base pad having a bottom surface and in a second horizontal plane downset from the first horizontal plane which allows the base pad to be positioned underneath the die pad;
a semiconductor chip mounted on the die pad and electrically connected to the leads; and
a resin encapsulant for enclosing the semiconductor chip, the die pad, a portion of the leads and a portion of the base pad in such a manner that the bottom surface of the base pad is exposed to an underside of the resin encapsulant.

7. The semiconductor package of claim 6, wherein the base pad is coupled to the die pad via a plurality of coupling leads.

8. The semiconductor package of claim 6, wherein the bottom surface of the base pad is planar with the underside of the resin encapsulant.

9. The semiconductor package of claim 6, wherein the bottom surface of the base pad provides the semiconductor chip with a direct heat dissipating path to the ambient.

10. The semiconductor package of claim 6 wherein the leads radially extend from the pad.

11. A semiconductor package, comprising:
a lead frame having a plurality of leads, a die pad having at least one opening and being planar with the leads in a first horizontal plane, and a base pad having a top surface and in a second horizontal plane elevated from the first horizontal plane which allows the die pad to be positioned underneath the base pad;
a semiconductor chip mounted on the die pad and electrically connected to the leads, the semiconductor chip being positioned between the base pad and the die pad; and
a resin encapsulant for enclosing the semiconductor chip, the die pad, a portion of the leads, and a portion of the base pad in such a manner that the top surface of the base pad is exposed to an aboveside of the resin encapsulant.

12. The semiconductor package of claim 11, wherein the base pad is coupled to the die pad via a plurality of coupling leads.

13. The semiconductor package of claim 11, wherein the top surface of the base pad is planar with the aboveside of the resin encapsulant.

14. The semiconductor package of claim 11, wherein the top surface of the base pad provides the semiconductor chip with a direct heat dissipating path to the ambient.

15. The semiconductor package of claim 11, wherein the leads radially extend from the die pad.

* * * * *

UNITED STATES PATENT AND TRADEMARK OFFICE
CERTIFICATE OF CORRECTION

PATENT NO. : 6,114,752
DATED : September 5, 2000
INVENTOR(S) : Chien-Ping Huang; Cheng-Yuan Lai; Raymond Jao It is certified that error appears in the above-identified patent and that said Letters Patent is hereby corrected as shown below:

<u>Title page,</u>
Item [75], please change the name of the first listed inventor "Chion-Ping Huang," to read [75] -- Chien-Ping Huang --

Signed and Sealed this

Twenty-sixth Day of March, 2002

*Attest:*

*Attesting Officer*

JAMES E. ROGAN
*Director of the United States Patent and Trademark Office*